(12) United States Patent
Shih et al.

(10) Patent No.: US 8,363,463 B2
(45) Date of Patent: Jan. 29, 2013

(54) PHASE CHANGE MEMORY HAVING ONE OR MORE NON-CONSTANT DOPING PROFILES

(75) Inventors: Yen-Hao Shih, Elmsford, NY (US); Huai-Yu Cheng, Hsinchu (TW); Chieh-Fang Chen, Panchiao (TW); Chao-I Wu, Hsinchu (TW); Ming Hsiu Lee, Hsinchu (TW); Hsiang-Lan Lung, Dobbs Ferry, NY (US); Matthew J. Breitwisch, Yorktown Heights, NY (US); Simone Raoux, New York, NY (US); Chung H Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 333 days.

(21) Appl. No.: 12/729,837

(22) Filed: Mar. 23, 2010

(65) Prior Publication Data

US 2010/0328996 A1   Dec. 30, 2010

Related U.S. Application Data

(60) Provisional application No. 61/220,502, filed on Jun. 25, 2009.

(51) Int. Cl.
*G11C 11/00* (2006.01)
(52) U.S. Cl. ............. 365/163; 365/148; 365/174; 257/2
(58) Field of Classification Search .................. 365/163, 365/148, 174; 257/2
See application file for complete search history.

(56) References Cited

U.S. PATENT DOCUMENTS

| | | | |
|---|---|---|---|
| 3,271,591 A | 9/1966 | Ovshinsky |
| 3,530,441 A | 9/1970 | Ovshinsky |
| 3,846,767 A | 11/1974 | Cohen |
| 4,177,475 A | 12/1979 | Holmberg |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |

(Continued)

FOREIGN PATENT DOCUMENTS

WO    2004025659 A1    3/2004

OTHER PUBLICATIONS

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

(Continued)

*Primary Examiner* — Vu Le
*Assistant Examiner* — Han Yang
(74) *Attorney, Agent, or Firm* — Haynes Beffel & Wolfeld LLP

(57) ABSTRACT

A phase change memory device with a memory element including a basis phase change material, such as a chalcogenide, and one or more additives, where the additive or additives have a non-constant concentration profile along an inter-electrode current path through a memory element. The use of "non-constant" concentration profiles for additives enables doping the different zones with different materials and concentrations, according to the different crystallographic, thermal and electrical conditions, and different phase transition conditions.

10 Claims, 11 Drawing Sheets

U.S. PATENT DOCUMENTS

| | | | |
|---|---|---|---|
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,596,522 A | 1/1997 | Ovshinsky et al. |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,825,046 A | 10/1998 | Czubatyj et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | Nirschl |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Chen |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |

| Patent/Publication | Date | Inventor |
|---|---|---|
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,355,238 B2 | 4/2008 | Takata et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,453,081 B2 | 11/2008 | Happ et al. |
| 7,473,576 B2 | 1/2009 | Lung |
| 7,479,649 B2 | 1/2009 | Lung |
| 7,485,891 B2 | 2/2009 | Hamann et al. |
| 7,488,968 B2 | 2/2009 | Lee |
| 7,501,648 B2 | 3/2009 | Chen et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,683,360 B2 | 3/2010 | Chen et al. |
| 7,688,619 B2 | 3/2010 | Lung et al. |
| 7,696,503 B2 | 4/2010 | Lung et al. |
| 7,701,759 B2 | 4/2010 | Lung et al. |
| 7,759,770 B2 | 7/2010 | Happ et al. |
| 7,868,313 B2 | 1/2011 | Breitwisch et al. |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0109351 A1 | 6/2004 | Morimoto et al. |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0126423 A1 | 6/2006 | Aratani et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0029606 A1 | 2/2007 | Noh et al. |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0097739 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |

| | | |
|---|---|---|
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0221906 A1* | 9/2007 | Hideki et al. ............ 257/2 |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0267721 A1 | 11/2007 | Kuh et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0042119 A1* | 2/2008 | Sandoval et al. ............ 257/4 |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Lung |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0078924 A1 | 3/2009 | Liang et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0044665 A1 | 2/2010 | Jedema |
| 2010/0055830 A1 | 3/2010 | Chen et al. |
| 2010/0084624 A1 | 4/2010 | Lung et al. |
| 2010/0144128 A1 | 6/2010 | Lung et al. |
| 2010/0151652 A1 | 6/2010 | Lung et al. |
| 2010/0157665 A1 | 6/2010 | Lung et al. |
| 2010/0193763 A1 | 8/2010 | Chen et al. |
| 2010/0270529 A1 | 10/2010 | Lung |
| 2010/0291747 A1 | 11/2010 | Lung et al. |
| 2010/0328995 A1 | 12/2010 | Shih et al. |
| 2010/0328996 A1 | 12/2010 | Shih et al. |
| 2011/0013446 A1 | 1/2011 | Lung |
| 2011/0034003 A1 | 2/2011 | Lung |
| 2011/0049456 A1 | 3/2011 | Lung et al. |

OTHER PUBLICATIONS

Strauss, Karl F. et al., "Overview of Radiation Tolerant Unlimited Write Cycle Non-Volatile Memory," IEEE Mar. 18-25, 2000, pp. 399-408.
Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.
Wicker, Guy, "A Comprehensive Model of Submicron Chalcogenide Switching Devices," Doctoral Dissertation, Wayne State University, Detroit, MI 1996, 137 pp.
Wolf, Stanley, Excerpt from: Silicon Processing for the VLSI Era-vol. 4, pp. 674-679, 2004.
Wuttig, Matthias, "Towards a Universal Memory?" Nature Materials, Apr. 2005, pp. 265-266, vol. 4.
Yamada, Noboru, "Potential of Ge-Sb-Te phase-change optical disks for high-data-rate recording in the near future," (Conference Proceedings Paper), Jul. 30, 1997, vol: 3109, 10 pages.
Yi, J. H. et al., "Novel Cell Structure of PRAM with Thin Metal Layer Inserted GeSbTe," IEEE IEDM Dec. 10, 2003, 4 pages.
Yonehara, T. et al., "Control of Grain Boundary Location by Selective Nucleation Over Amorphous Substrates, " Mat. Res. Soc. Symp. Proc., vol. 106, 1998, pp. 21-26.
"Magnetic Bit Boost," www.sciencenews.org, Dec. 18 & 25, 2004, p. 389, vol. 166.
"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, 21 to 23 Sep. 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Czubatyj, Wally, et al., "Current Reduction in Ovonic Memory Devices," E*PCOS06 2006, 10 pages.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change Ram," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "Oum-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Lee, Tae-Yon, et al., "Separate domain formation in Ge2Sb2Te5—Siox mixed layer," Appl. Phys. Lett. 89, 163503, Oct. 16, 2006, 3 pages.

Li, Yiming, "Temperature dependence on the contact size of GeSbTe films for phase change memories," J. Comput Electron (2008) 7:138-141.

Morikawa et al., "Doped In-Ge-Te Phase Change Memory Featuring Stable Operation and Good Data Retention", IEEE, 2007, pp. 307-310.

Mott, Nevill, "Electrons in Glass," Nobel Lecture, Dec. 8, 1977, Physics, 1977, pp. 403-413.

Noh, Jin-Seo, et al., "Modification of Ge2Sb2Te5 by the Addition of SiOx for Improved Operation of Phase Change Random Access Memory," Mater. Res. Soc. Symp. Proc. vol. 888-V05-09.1, 2006, 6 pages.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n. Junctions Using Vapor Phase Doping for Application in Multi-Resurf Devices," IEEE Jun. 4-7, 2002, pp. 237-240.

Ryu, Seung Wook, et al., "SiO2 Incorporation Effects in Ge2Sb2Te5 Films Prepared by Magnetron Sputtering for Phase Change Random Access Memory Devices," Electrochemical and Solid-State Letters, 9 (8) G259-G261, May 23, 2006.

* cited by examiner

PHASE CHANGE MEMORY HAVING ONE OR MORE NON-CONSTANT DOPING PROFILES

CROSS-REFERENCE TO RELATED APPLICATIONS

Benefit of U.S. Provisional Application No. 61/220,502, filed 25 Jun. 2009 is hereby claimed.

BACKGROUND OF THE INVENTION

1. Field of the Invention

The present invention relates to memory devices based on phase change materials including chalcogenide materials, and methods for manufacturing such devices.

2. Description of Related Art

Phase change based memory materials, like chalcogenide based materials and similar materials, can be caused to change between an amorphous phase and a crystalline phase by application of electrical current at levels suitable for implementation in integrated circuits. The amorphous phase is characterized by higher electrical resistivity than the crystalline phase, which can be readily read to indicate data. These properties have generated interest in using programmable resistive material to form non-volatile memory circuits, which can be read and written with random access.

The change from the amorphous to the crystalline phase is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

One problem arising in phase change devices involves data retention. Phase change memory cells can suffer a drift in resistance over time, as the active region composition shifts from amorphous to crystalline phase, or vice versa, due to environmental conditions to which the device is exposed. For example, a memory cell in which the active region has been reset to a generally amorphous state may over time develop a distribution of crystalline regions in the active region. If these crystalline regions connect to form a low resistance path through the active region, when the memory cell is read a lower resistance state will be detected and result in a data error. See Gleixner, "Phase Change Memory Reliability," 22nd NVSMW, 2007.

Another problem with phase change memory cells involves reliability issues arising from the difference in density between the crystalline and amorphous phases. The change in volume that occurs because the transition from the amorphous phase to the crystalline phase causes stress within the memory material and at the interface with electrodes. During operation, repeated set and reset operations can cause formation of voids in the phase change material, which can lead to device failure and limit the cycle endurance of the cell. Also, during manufacturing, high temperature back-end-of-line (BEOL) processes can cause a transition from the as-deposited amorphous phase into the higher density crystalline phase, which can cause voids that result in device failure.

Chalcogenides and other phase change materials can be combined with additives to modify conductivity, transition temperature, melting temperature, and other properties of the material. Combining phase change materials with additives is sometimes referred to as "doping with impurities" or adding "dopants." The terms "additive," "dopant" or "impurity" can be used interchangeably in connection with this specification. Representative additives used with chalcogenides include nitrogen, silicon, oxygen, silicon oxide, silicon nitride, copper, silver, gold, aluminum, aluminum oxide, tantalum, tantalum oxide, tantalum nitride, titanium and titanium oxide. See, for example, U.S. Pat. No. 6,800,504 (metal doping), and U.S. Patent Application Publication No. U.S. 2005/0029502 (nitrogen doping). Research has progressed to provide memory devices that operate with low reset current by adjusting the doping concentration in phase change memory.

U.S. Pat. No. 6,087,674 and its parent U.S. Pat. No. 5,825,046 by Ovshinsky et al., describe forming composite memory material in which phase change material is mixed with a relatively high concentration of dielectric material in order to manage the resistance of the composite memory material. The nature of the composite memory material described in these patents is not clear, because it describes composites as layered structures as well as mixed structures. The dielectric materials described in these patents cover a very broad range.

A number of researchers have investigated the use of silicon oxide doping of chalcogenide material for the purposes of reducing the reset current needed for operation of the memory devices. See Ryu, et al., "$SiO_2$ Incorporation Effects in $Ge_2Sb_2Te_5$ Films Prepared by Magnetron Sputtering for Phase Change Random Access Memory Devices," Electrochemical and Solid-State Letters, 9 (8) G259-G261 (2006); Lee et al., "Separate domain formation in $Ge_2Sb_2Te_5$—SiOx mixed layer," Appl. Phys. Lett. 89,163503 (2006); Czubatyj et al., "Current Reduction in Ovonic Memory Devices," E*PCOS06 (2006); and Noh et al., "Modification of Ge2Sb2Te5 by the Addition of SiOx for Improved Operation of Phase Change Random Access Memory," Mater. Res. Soc. Symp. Proc. Vol. 888 (2006). These references suggest that relatively low concentrations of silicon oxide doping in $Ge_2Sb_2Te_5$ (GST) result in substantial increases in resistance and corresponding reductions in reset current. The Czubatyj et al. article suggests that the improvement in resistance in a silicon oxide doped GST alloy saturates at about 10 vol % (6.7 at %), and reports that doping concentrations up to 30 vol % silicon oxide had been tested, without providing details. The Lee et al. publication describes a phenomenon at relatively high doping concentrations around 8.4 at %, by which the silicon oxide appears to separate from the GST after high-temperature annealing to form domains of GST surrounded by boundaries that are primarily silicon oxide. Doping with silicon dioxide also results in reduction in grain size in the polycrystalline phase of the material, and improves manufacturability.

Hudgens, U.S. Patent Application Publication No. US 2005/0029502, describes a composite doped GST, where nitrogen or nitrogen and oxygen are alleged to cause reduction in grain size, while a second dopant, such as titanium, is applied in a manner that increases the set programming speed. The second dopant in Hudgens is applied to offset an increase in the time needed for set programming caused by nitrogen doping. However, it is found that gas phase dopants like nitrogen and oxygen, while causing a reduction in grain size in the deposited material, have not been reliable, and result in void formations in the material during use.

Chen et al., U.S. Pat. No. 7,501,648 entitled PHASE CHANGE MATERIALS AND ASSOCIATED MEMORY DEVICES, issued 10 Mar. 2009, describes phase change material doped using nitride compounds to affect transition speeds.

Our co-pending U.S. patent application entitled DIELECTRIC MESH ISOLATED PHASE CHANGE STRUCTURE FOR PHASE CHANGE MEMORY, application Ser. No. 12/286,874, filed 2 Oct. 2008, describes the use of silicon dioxide doping in relatively high concentrations and addresses some of the issues discussed above related to changes in composition of the phase change memory materials.

Although substantial benefits in yield can be achieved using additives, issues such as data retention and reliability still arise. Additionally, the use of additives can adversely impact a variety of memory performance characteristics such as set programming speed and threshold voltage compared to that of undoped phase change material, restricting the use of phase change based memory circuits in certain applications.

It is therefore desirable to provide memory cells addressing the yield, endurance, and data retention issues discussed above.

SUMMARY OF THE INVENTION

A phase change memory device is described herein with a memory element including a basis phase change material, such as a chalcogenide like GST, and one or more additives, where the additive or additives have a non-constant concentration profile along an inter-electrode current path through a memory element. The device includes a first electrode, a phase change memory element in contact with the first electrode, and a second electrode in contact with the memory element. The memory element has a body of phase change material that can be characterized as having zones which are subject to different thermal and electrical conditions, and phase transition conditions, during to operation of the device. A first zone is the region in contact with the first electrode. A second zone is the active region. A third zone is the region between the active region and the contact with the second electrode. A fourth zone is the region in contact with the second electrode. The use of "non-constant" additive concentration profiles enables doping the different zones with different materials and concentrations, according to the different stress, crystallographic, thermal and electrical conditions, and different phase transition conditions.

In one embodiment described herein, the phase change memory material comprises a basis phase change material having a first additive concentration profile distribution in a first layer adjacent the first electrode and a second additive concentration profile distribution in a second layer adjacent the second electrode. The active region in the phase change memory material is within the first layer. The first additive concentration profile distribution is adapted to improve stability in resistance of the lower resistance phase, and the second additive concentration profile is adapted to improve cycling endurance of the memory cell. In one example, a GST phase change material is used as a basis, and silicon is used as an additive in the first layer, while silicon dioxide is used as an additive in both the first and second layers. This provides a cell that has improved stability in impedance in the lower resistance state over set/reset cycling, while resisting void formation. Also, the absence of silicon doping in the second layer reduces overall resistance of the cell.

An integrated circuit memory device is described based on phase change memory devices having non-constant additive profiles. Other aspects and advantages of the present invention can be seen on review of the drawings, and the detailed description.

DETAILED DESCRIPTION

A detailed description of embodiments of the present invention is provided with reference to the FIGS. 1-11.

Figure 1:
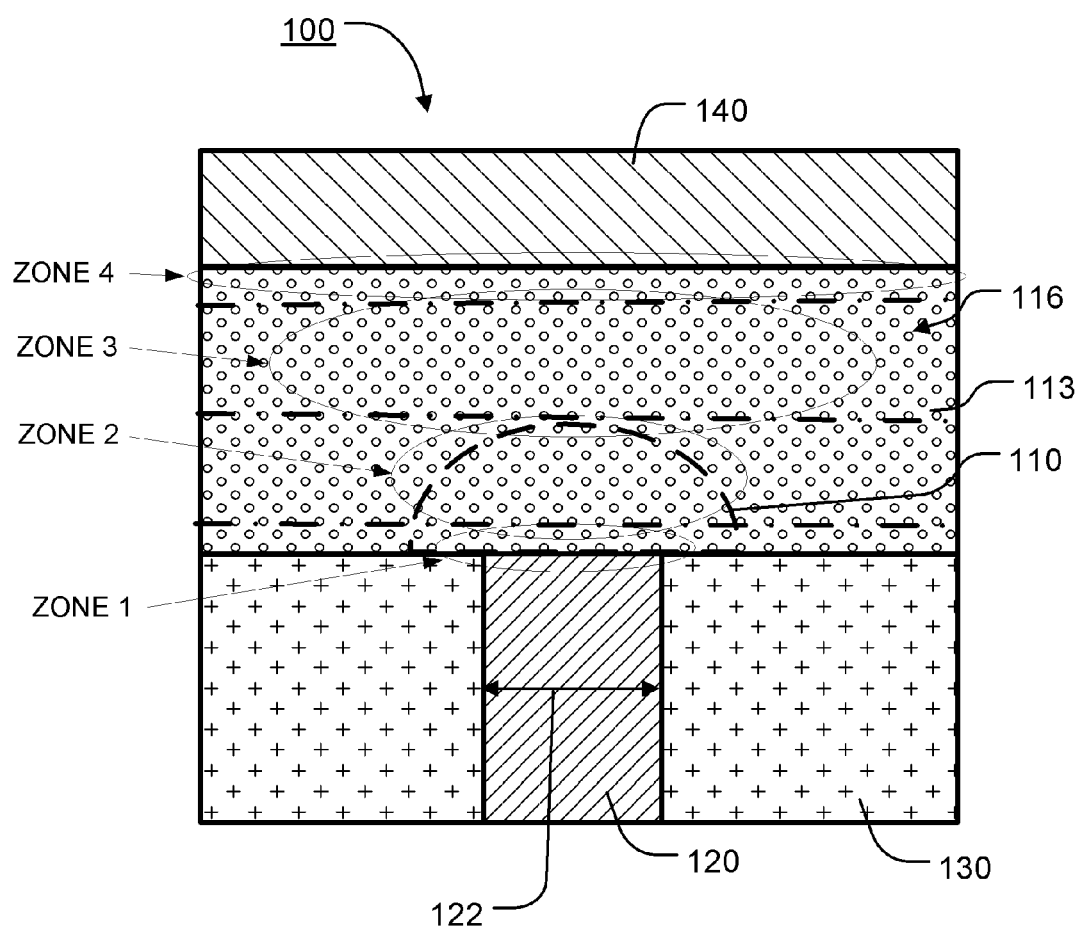
FIG. 1 is a simplified cross-section of a memory cell having zones which are subject to different thermal and electrical conditions, and phase transition conditions, during operation of the device.

FIG. 1 illustrates a cross-sectional view of a memory cell 100 including a memory element 116 consisting of a body of phase change material having a non-constant additive concentration profile along an inter-electrode current path through memory element 116. As described below, the non-constant additive concentration profile includes a first additive concentration profile in an active region 110 and a second additive concentration profile in an inactive region 113 outside the active region 110.

The memory cell 100 includes a first electrode 120 extending through dielectric 130 to contact a bottom surface of the memory element 116, and a second electrode 140 on the memory element 116. The first and second electrodes 120, 140 may comprise, for example, TiN or TaN. Alternatively, the first and second electrodes 120, 140 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

In the illustrated embodiment the dielectric 130 comprises SiN. Alternatively, other dielectric materials may be used.

As can be seen in FIG. 1, the relatively narrow width 122 (which in some embodiments is a diameter) of the first electrode 120 results in an area of contact between the first electrode and the memory element that is less than the area of contact between the memory element 116 and the top electrode 140. Thus current is concentrated in the portion of the memory element 116 adjacent the first electrode 120, resulting in the active region 110 in contact with or near the bottom electrode 120, as shown. The memory element 116 also includes an inactive region 113, outside the active region 110, which is inactive in the sense that it does not undergo phase transitions during operation. The memory element includes a basis phase change material, that can be characterized has having four zones. Zone 1 is at the interface between the phase change material and the first electrode 120. Zone 2 is a layer that encompasses the active region of the memory element. Zone 3 is a layer between the active region and the interface with the second electrode 140. Zone 4 is at the interface with the second electrode 140. Zones 1-4 can have significantly different thermal, electrical, crystallographic and stress characteristics during manufacturing and during operation of the device. Each zone therefore is a candidate for a different profile of additives to the basis phase change material to enhance performance. Depending on the structure of the memory cell and the location of the active region in the phase change material, the interface zones 1 and 4 may or may not include part of the active region. Also, for an active region spaced away from the electrodes, there may be two intermediate zones, between the active region and respective first and second electrodes.

Figure 2:
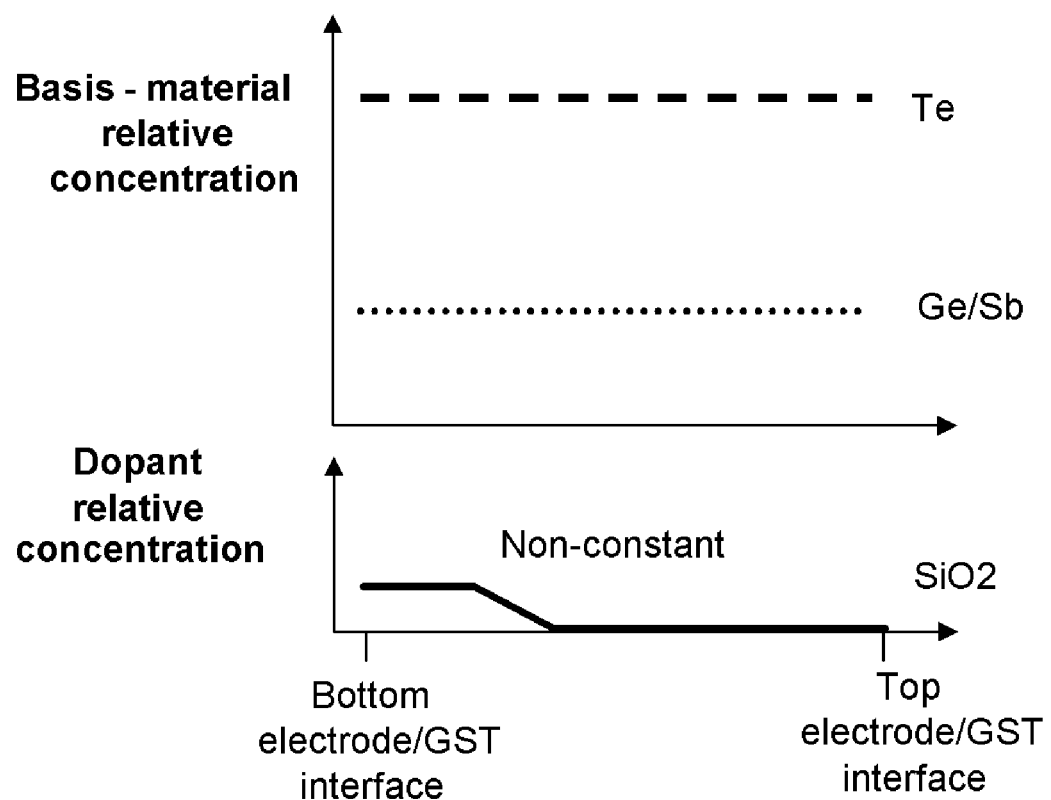
FIG. 2 is a graph showing concentration profiles of a basis material and a single additive in a phase change memory element.

The basis phase change material of memory element 116 in this example comprises $Ge_2Sb_2Te_5$. The basis material can be defined as the combination of elements selected as the phase change material, and deposited with a concentration profile that is characteristic of that material. As additives are combined, the concentrations of the elements of the basis material do not change relative to one another. Rather, the basis phase change material is doped with an additive in this example which is silicon dioxide having a non-constant additive concentration profile along the inter-electrode current path between the bottom and top electrodes 120, 140 as shown in FIG. 2. In this non-constant additive concentration profile, the silicon and oxygen components of silicon dioxide have a combined concentration of about 15 at % in the first and second zones, and falls off in concentration through the inactive region in the third zone, to a level of at or near 0 at % in the fourth zone adjacent the top electrode 140. Other chalcogenides and other additives may be used as well.

For example, other basis phase change materials may include $Ge(x)Sb(2y)Te(x+3y)$, where x and y are integers (including 0). Other basis phase change materials other than GeSbTe-based materials can also be used, including GaSbTe system, which can be described as $Ga(x) Sb(x+2y)Te(3y)$, and x, y are integers. Alternatively, the basis phase change material can be selected from a $Ag(x)In(y)Sb2Te3$ system, where x, y decimal numbers that can be below 1.

FIG. 2 illustrates a first embodiment of the non-constant additive concentration profile using silicon oxide as an additive. As can be seen in FIG. 2, the concentration of $SiO_2$ is higher at the interface between the bottom electrode 120 and the memory element 116, than at the interface between the top electrode 140 and the memory element 116. In the illustrated example of FIG. 2 additives of the phase change material at the interface between the bottom electrode 120 and the memory element 116 have an Si concentration of about 5 at %+/−2% at, and an O concentration of about 10 at %+/−4 at %. The concentration of $SiO_2$ then transitions downward to substantially undoped GST at the interface with the top electrode, resulting in the non-constant additive concentration profile as shown.

The active region 110 comprises phase change material domains within a dielectric-rich mesh (not shown), caused by separation of the silicon oxide doping from the phase change alloy, as described in detail in U.S. patent application entitled DIELECTRIC MESH ISOLATED PHASE CHANGE STRUCTURE FOR PHASE CHANGE MEMORY, application Ser. No. 12/286,874, referred to above.

Figure 10:
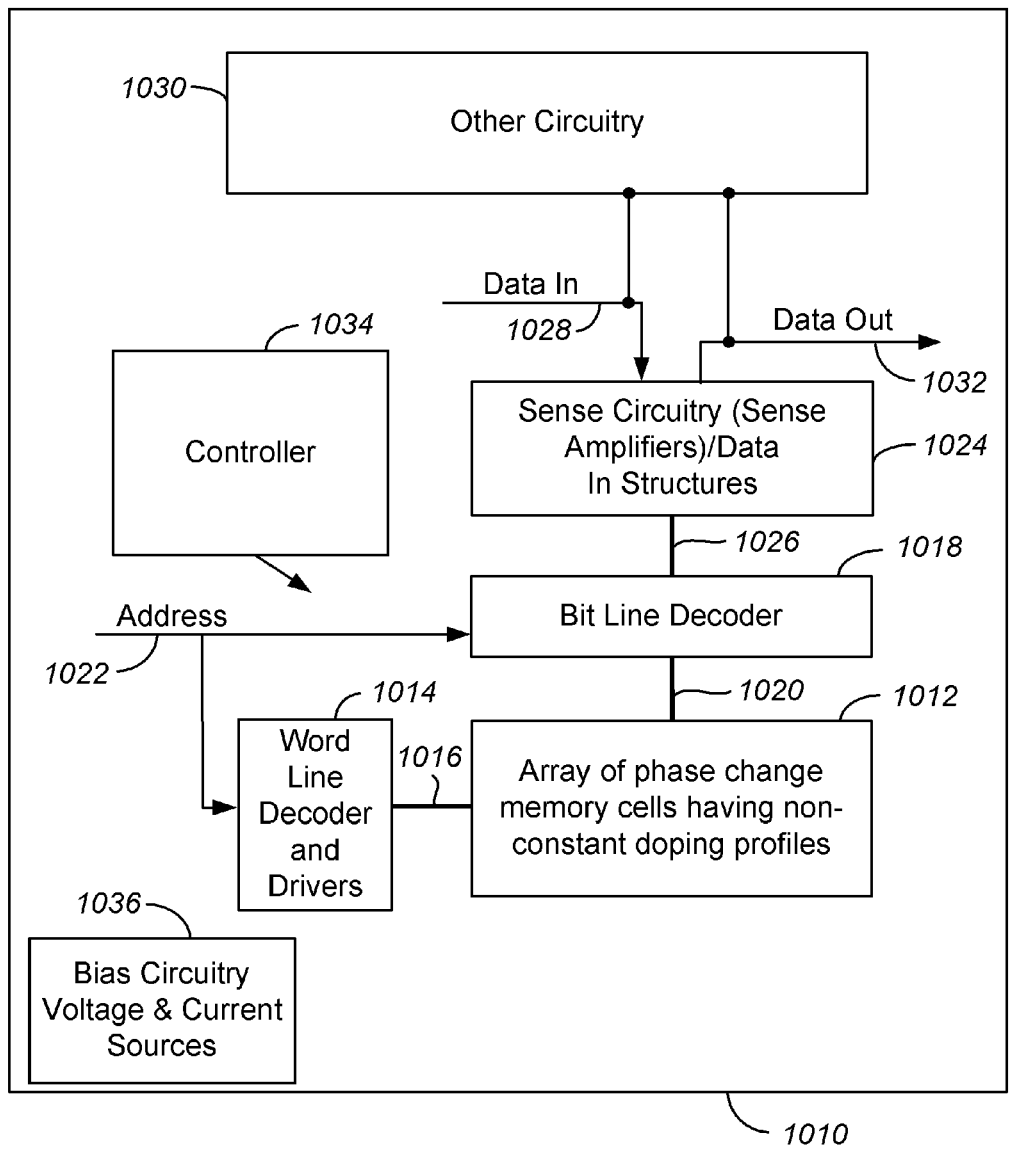
FIG. 10 is a schematic diagram of an integrated circuit memory device including an array of phase change memory cells having non-constant additive profiles.

In a reset operation of the memory cell 100, bias circuitry (See, for example, bias circuitry voltage and current sources 1036 of FIG. 10 with the accompanying controller 1034) coupled to the first and second electrodes 120, 140 induces a current to flow between the first and second electrodes 120, 140 via the memory element 116 sufficient to induce a high resistance generally amorphous phase in the phase change domains of the active region 110 to establish a high resistance reset state in the memory cell 100.

GST-based memory materials generally include two crystalline phases, a lower transition temperature FCC (face-centered cubic) phase and a higher transition temperature HCP (hexagonal close-packed) phase, the HCP phase having a higher density than the FCC phase. In general the transition from the FCC phase to the HCP phase is not desirable since the resulting decrease in memory material volume causes stresses within the memory material and at the interfaces between electrodes and the memory material. The transition of undoped $Ge_2Sb_2Te_5$ from the FCC phase to the HCP phase occurs below an anneal temperature of 400° C. Since a memory cell comprising undoped Ge2Sb2Te5 may experience a temperature of 400° C. or more during set operations, issues can arise in the reliability of the memory cell due to this transition to the HCP state. Also, the speed of transition to the HCP phase will be slower.

Over the life of a memory cell, these volume shifts can encourage formation of voids in the active region, leading to device failure.

It is found that $Ge_2Sb_2Te_5$ material having 10 at % and 20 at % silicon oxide, remains in the FCC state at an anneal temperature of up to 400° C. Moreover, doped $Ge_2Sb_2Te_5$ material having 10 at % and 20 at % silicon oxide has a smaller grain size than undoped $Ge_2Sb_2Te_5$. As a result, memory cells comprising doped $Ge_2Sb_2Te_5$ material having 10 to 20 at % silicon oxide annealed at temperatures as high as 400° C. during BEOL processes or set operations avoid the higher density HCP state, and thus experience less mechanical stress and have increased reliability and higher switching speed, compared to memory cells comprising undoped $Ge_2Sb_2Te_5$.

The stoichiometry of a phase change material tends to change inside the active region of the device, relative to the outside the active region because of the more extreme thermal conditions there, as the materials tend to migrate to more stable conditions according to the thermal environment. By doping the active region with the first additive concentration profile that tends to strengthen the phase change material by suppressing the migration of voids, the yield, endurance and retention of the memory device are dramatically improved.

Figure 3:
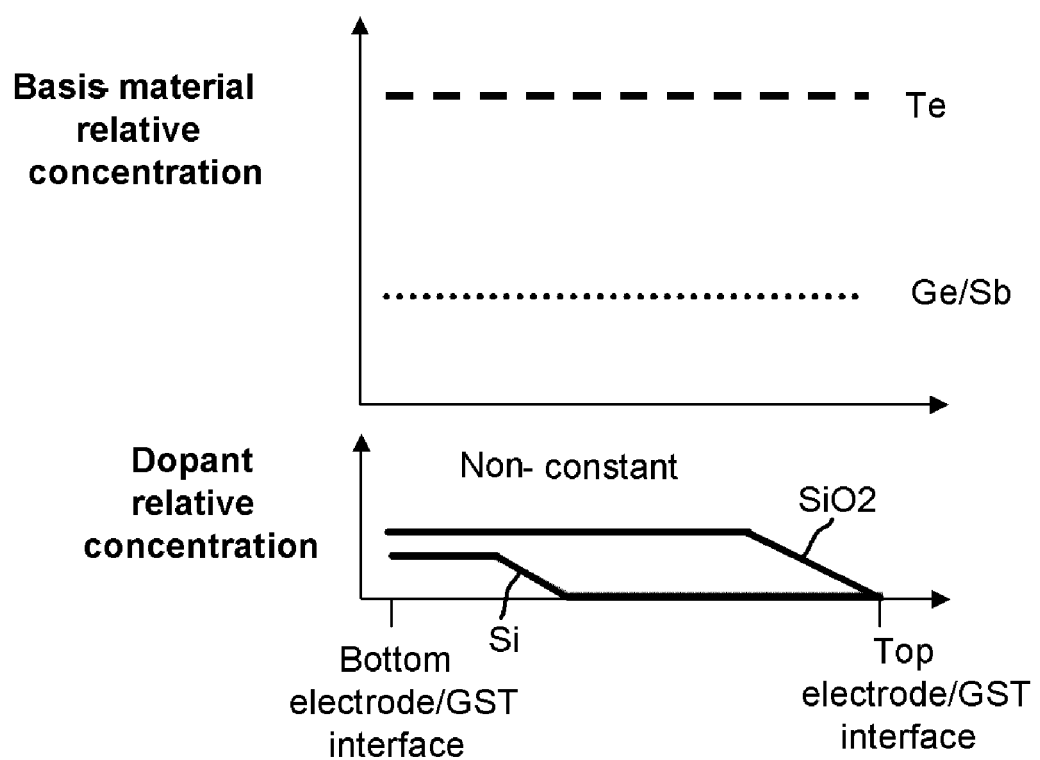
FIG. 3 is a graph showing concentration profiles of a basis material and a combination of two additives in a phase change memory element.

FIG. 3 illustrates a second embodiment of a non-constant additive concentration profile using a composite doping of silicon oxide and silicon. In the illustrated example of FIG. 3, the silicon oxide additive of the phase change material at the interface between the bottom electrode 120 and the memory element 116 has a Si concentration of about 5 at %+/−2% at, and an O concentration of about 10 at %+/−4 at %. The maximum silicon additive in this example is between about 1 to 5 at % in addition to the silicon that is counted part of the silicon dioxide. Thus, a consolidated concentration profile for the elements silicon and oxygen, along with the GST basis material can include at 10% silicon, 10 at % oxygen and 80 at % for the combination of the elements of GST. It is found that silicon additives improve retention time and endurance, but can retard set time. Putting higher concentrations of silicon within the active region 110 can improve retention in the active region, while for regions far away from the active region 110 do not significantly impact retention. Also, the reduction of silicon doping away from the active region may reduce the overall resistance of the memory cell, and improve the ability to scale the technology to lower and lower operating voltages.

Figure 4:
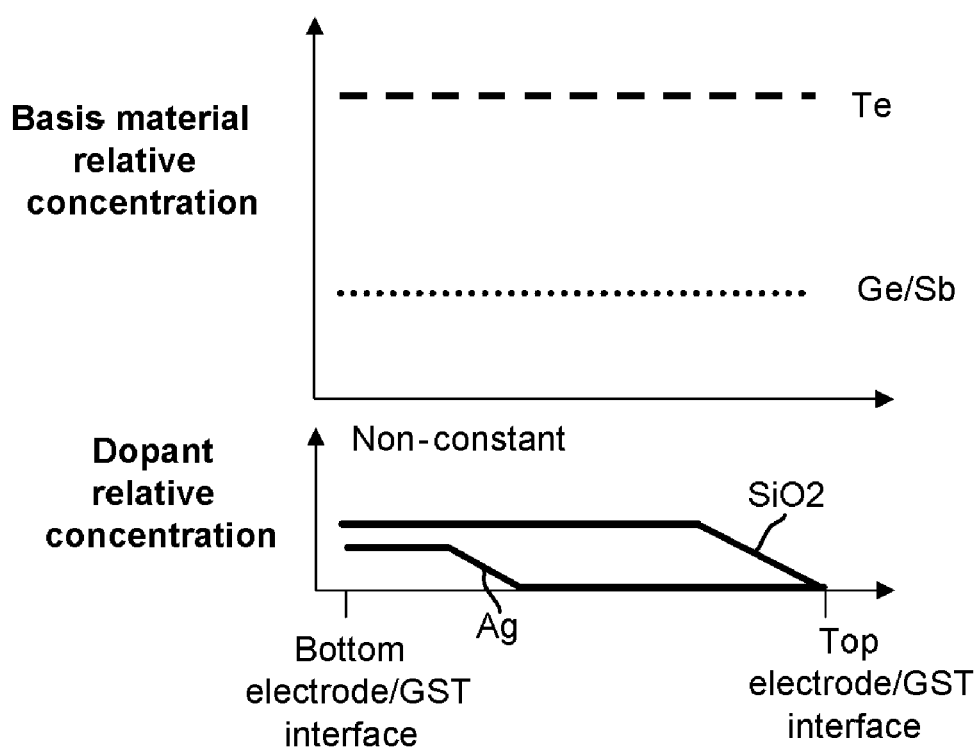
FIG. 4 is a graph showing concentration profiles of a basis material and different combination of two additives in a phase change memory element.

FIG. 4 illustrates a third embodiment of a non-constant additive concentration profile using a composite doping of silicon oxide and silver. In the illustrated example of FIG. 4 the silicon oxide additive of the phase change material at the interface between the bottom electrode 120 and the memory element 116 has a Si concentration of about 5 at % +/−2% at, and an O concentration of about 10 at %+/−4 at %. It is found that adding silver can improve retention but can also make the cells' threshold voltage too high for practical implementation in a chip. The non-constant additive concentration profile of silver may lower the threshold voltage to a practical value while still providing good retention for the cell.

Figure 5:
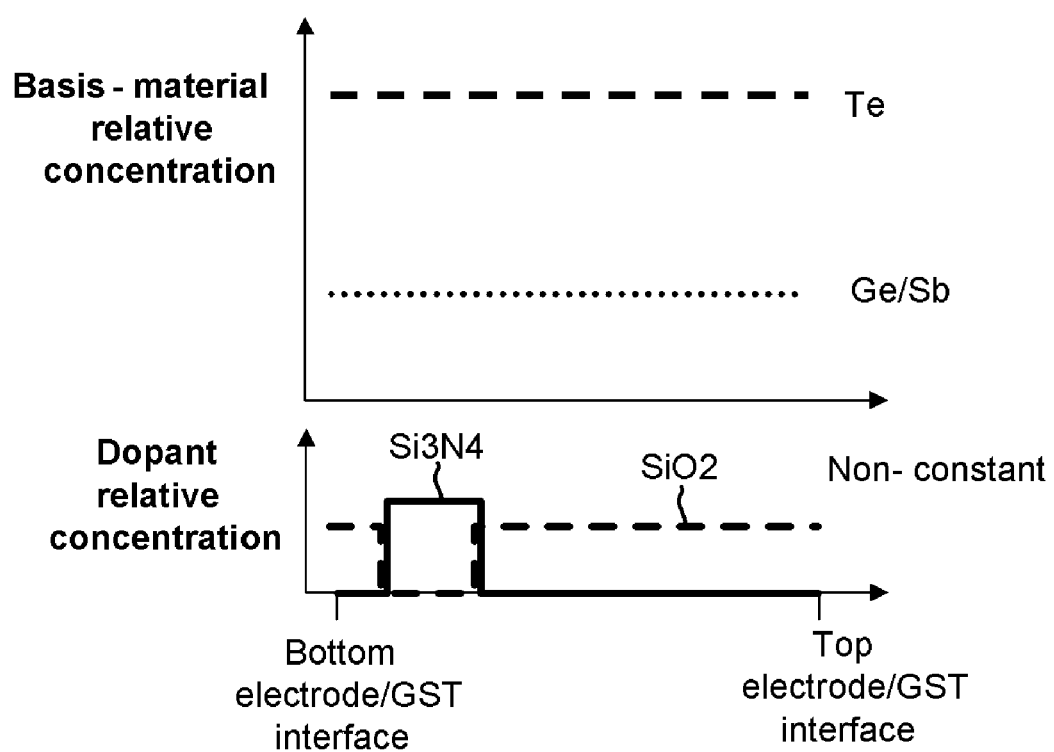
FIG. 5 is a graph showing concentration profiles of a basis material and another different combination of two additives in a phase change memory element.

FIG. 5 illustrates a fourth embodiment of a non-constant additive concentration profile using a composite doping of silicon oxide and silicon nitride. In the illustrated example of FIG. 4 the silicon oxide additive of the phase change material at the interface between the bottom electrode 120 and the memory element 116 has an Si concentration of about 5 at %+/−2% at, and an O concentration of about 10 at %+/−4 at %. The maximum silicon nitride additive in this example is 5 at %+/−2 at % for silicon, and 8.3 at %+/−3.3 at % for nitride. It is found that SiN-doped GST provides better retention time than SiO2-GST, but the device fails earlier than SiO2-GST. The embodiment of FIG. 5 is proposed for better endurance and retention than when the entire active region is constantly doped with SiN, by doping the interface zones adjacent the first and second electrodes with SiO2, doping the active region with SiN without significant contribution of SiO2 in the region. Also the bulk region between the SiN doped region and the interface region at the top electrode is doped only with SiO2 in this example.

Other additives may also be used in a non-constant additive concentration profile. For example, it is found that InGeTe, which can be formed using In doping in a GST basis phase change material can provide high temperature retention. It is also found that Ge can improve retention in a manner similar to silicon.

Figure 6:
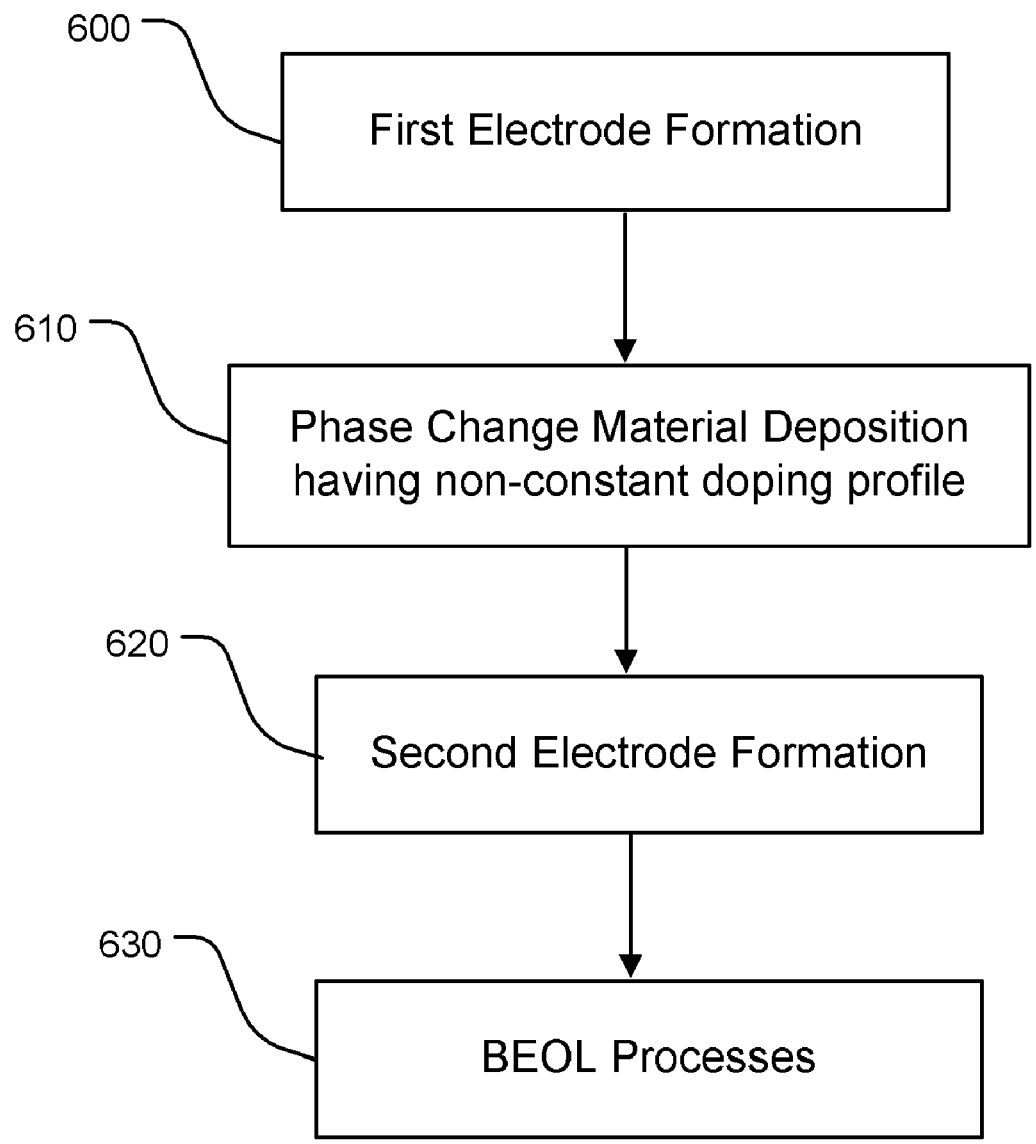
FIG. 6 is a simplified diagram of a manufacturing process using phase change materials with a non-constant additive or doping profile.

FIG. 6 illustrates a manufacturing process for manufacturing a memory cell having a non-constant additive concentration profile as described herein, having a structure like that of FIG. 1. Reference numerals applied to elements of the memory cell correspond to those used in FIG. 1.

At step 600 the first electrode 120 having a width or diameter 122 is formed extending through dielectric 130. In the illustrated embodiment, the first electrode 120 comprises TiN and the dielectric 130 comprises SiN. In some embodiments the first electrode 120 has a sublithographic width or diameter 122.

The first electrode 120 extends through dielectric 130 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 120 and the dielectric layer 130 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Publication 2008/0191187), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 120. Next the mask of photoresist is trimmed, using for example oxygen plasma, to form a mask structure having sublithographic dimensions overlying the location of the first electrode 120. Then the layer of electrode material is etched using the trimmed mask of photoresist, thereby forming the first electrode 120 having a sublithographic diameter 122. Next dielectric material 130 is formed and planarized.

As another example, the first electrode 120 and dielectric 130 can be formed using methods, materials, and processes as disclosed in U.S. patent application Ser. No. 11/855,979 filed on 14 Sep. 2007 entitled "Phase Change Memory Cell in Via Array with Self-Aligned, Self-Converged Bottom Electrode and Method for Manufacturing" (now U.S. Publication 2009/0072215) which is incorporated by reference herein. For example, the dielectric 130 can be formed on the top surface of access circuitry followed by sequentially forming an isolation layer and a sacrificial layer. Next, a mask having openings close to or equal to the minimum feature size of the process used to create the mask is formed on the sacrificial layer, the openings overlying the location of the first electrode 120. The isolation layer and the sacrificial layers are then selectively etched using the mask, thereby forming a via in the isolation and sacrificial layers and exposing a top surface of the dielectric layer 130. After removal of the mask, a selective undercutting etch is performed on the via such that the isolation layer is etched while leaving the sacrificial layer and the dielectric layer 130 intact. A fill material is then formed in the via, which, due to the selective undercutting etch process, results in a self-aligned void in the fill material being formed within the via. Next, an anisotropic etching process is performed on the fill material to open the void, and etching continues until the dielectric layer 130 is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric layer 130 is etched using the sidewall spacers as an etch mask, thereby forming an opening in the dielectric layer 130 having a diameter less than the minimum feature size. Next, an electrode layer is formed within the openings in the dielectric layer 130. A planarizing process, such as chemical mechanical polishing CMP, is then performed to remove the isolation layer and the sacrificial layer and to form the first electrode 120.

At step 610 a phase change element is formed, comprising a basis phase change material $Ge_2Sb_2Te_5$ with having a non-constant additive concentration profile.

The non-constant additive concentration profile can be achieved using a variety of techniques. For example, by co-sputtering the basis material, GST, with an additive by using different sputter guns in the same chamber, and adjusting the additive concentration profile by turning on or off the respective doping sputtering gun. As another example, by sputtering a doped GST single target in one chamber, then move to the 2nd chamber for the other doped/undoped GST target, etc. As yet another example, by sputtering an undoped GST target in one chamber, then move to the 2nd chamber for doped GST single-target-sputtering, and move to the 3rd chamber for another doped GST layer, and so on. In alternatives, the memory material can be sputtered using a composite target. Also, other deposition technologies can be applied, including chemical vapor deposition, atomic layer deposition and so on.

Next, at step 620 a second electrode is formed and at step 630 back-end-of-line (BEOL) processing is performed to complete the semiconductor process steps of the chip, resulting in the structure illustrated in FIG. 1. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 10 are formed on the device.

In the mushroom cell of FIG. 1, the current is concentrated by the bottom electrode, resulting in the active region 110 being adjacent the bottom electrode. Thus, the non-constant additive concentration profiles are as shown in FIGS. 2-5 to suppress the migration of voids within the active region 110.

For symmetric structures, such bridge or pillar structures discussed below, the active region can be spaced away from the electrodes. For this kind of case, the additive concentration profile can be symmetric about the active region. For example, to apply the concept of the first embodiment shown in FIG. 2 to bridge/pillar devices, the additive concentration profile (from the first electrode to the second electrode) can be undoped GST, GST with increasing $SiO_2$ additive, GST with constant $SiO_2$-doping, GST with decreasing $SiO_2$ doping, and undoped GST. Thus, for mushroom cells the hottest spot is close to the bottom electrode, and the additive concentration profile changes with respect to the hottest spot. For bridge or pillar cells, the additive concentration profile is adjusted from those of mushroom cells based on the location of the active region.

Figure 7:
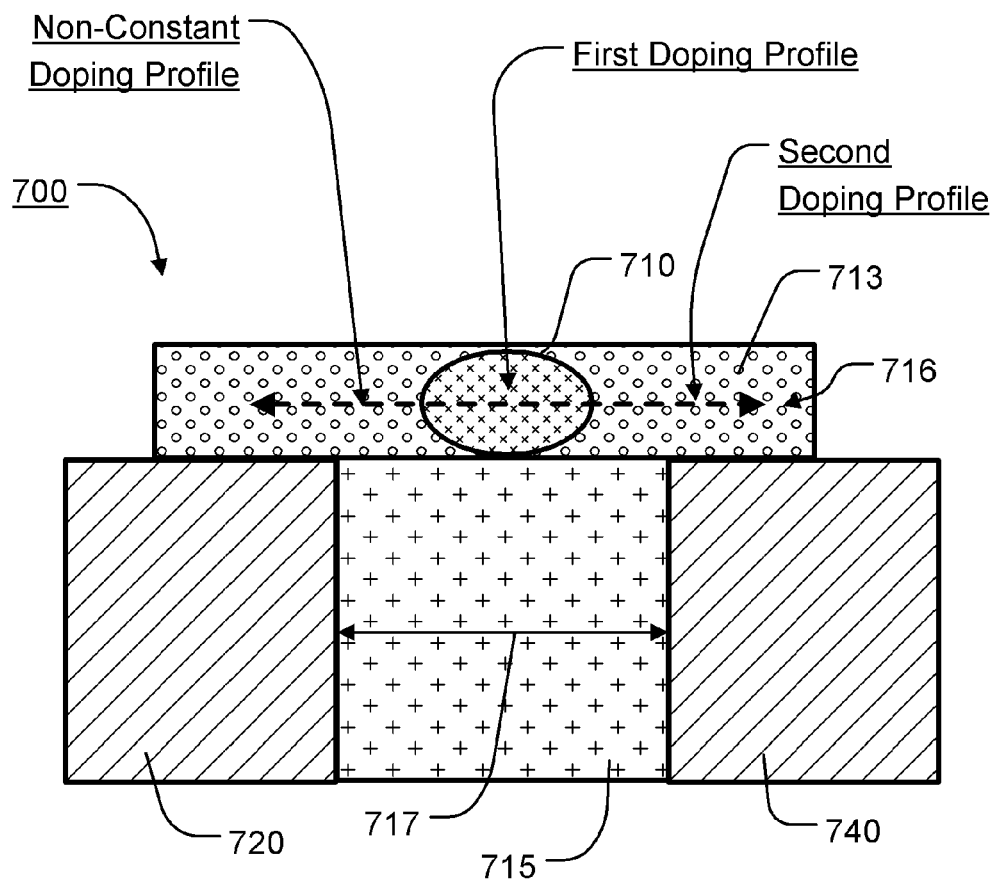
FIG. 7 is a schematic diagram of a first embodiment of a memory cell having a phase change memory element with a non-constant additive or doping profile.
Figure 8:
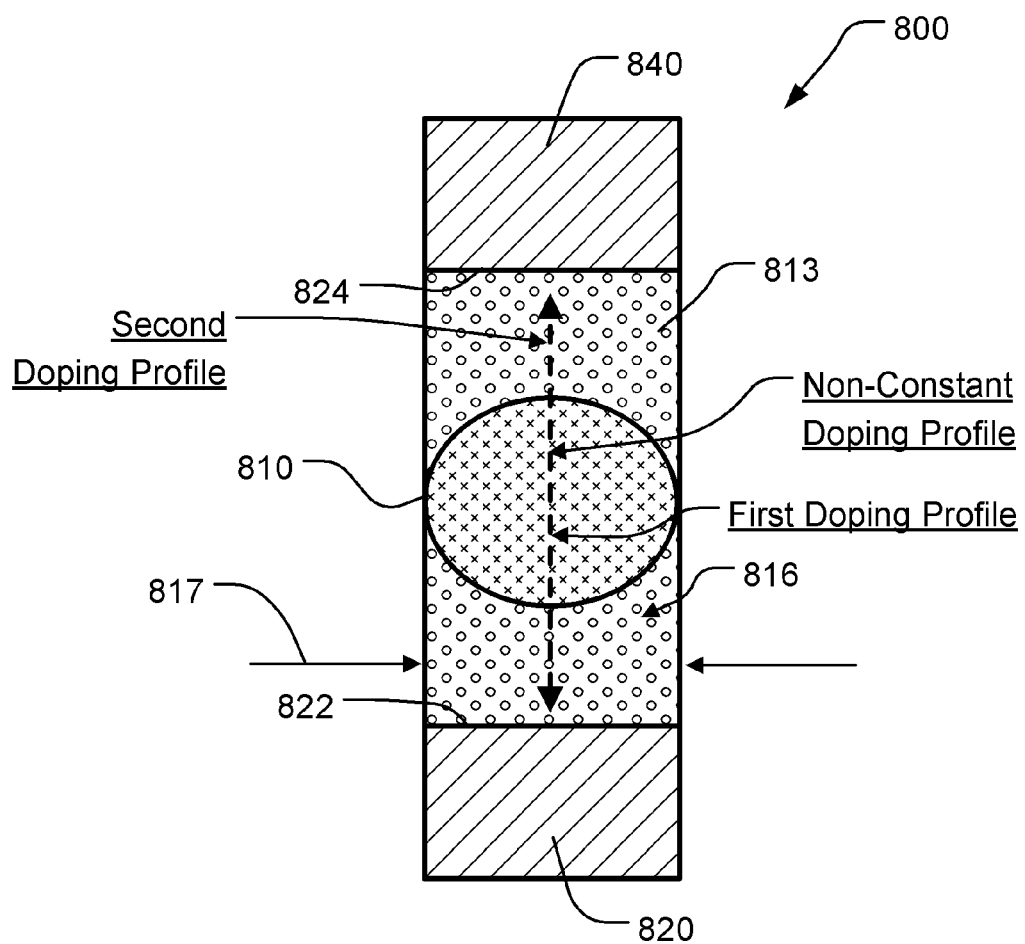
FIG. 8 is a schematic diagram of a second embodiment of a memory cell having a phase change memory element with a non-constant additive or doping profile.
Figure 9:
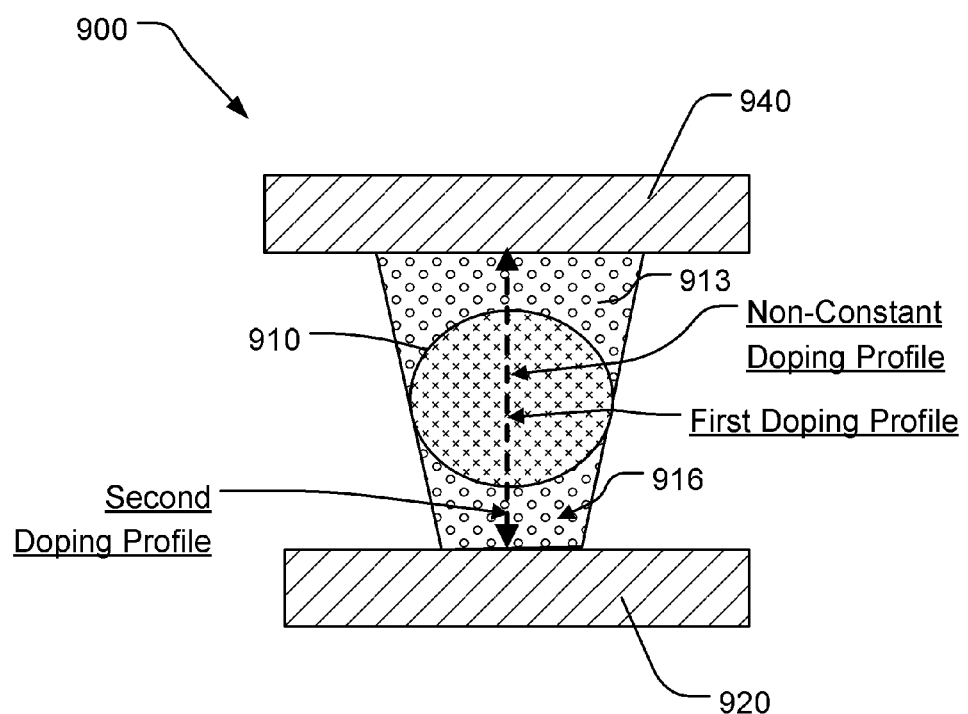
FIG. 9 is a schematic diagram of a third embodiment of a memory cell having a phase change memory element with a non-constant additive or doping profile.

FIGS. 7-9 illustrate alternative structures for non-constant additive concentration profile memory cells, having an active region comprising phase change domains within a dielectric-rich mesh. The materials described above with reference to the elements of FIG. 1 may be implemented in the memory cells of FIGS. 7-9, and thus a detailed description of these materials is not repeated.

FIG. 7 illustrates a cross-sectional view of a memory cell 700 including a memory element 716 consisting of a body of phase change material having a non-constant additive concentration profile along an inter-electrode current path through memory element 716. The non-constant additive concentration profile includes a first additive concentration profile in an active region 710 and a second additive concentration profile in an inactive region 713 outside the active region 710. The active region 710 comprises phase change material domains within a dielectric-rich mesh (not shown), caused by separation of the silicon oxide doping from the phase change alloy, as described in detail in U.S. patent application entitled DIELECTRIC MESH ISOLATED PHASE CHANGE STRUCTURE FOR PHASE CHANGE MEMORY, application Ser. No. 12/286,874, referred to above.

The memory cell 700 includes a dielectric spacer 715 separating first and second electrodes 720, 740. Memory element 716 extends across the dielectric spacer 715 to contact the first and second electrodes 720, 740, thereby defining an inter-electrode current path between the first and second electrodes 720, 740 having a path length defined by the width 717 of the dielectric spacer 715. In operation, as current passes between the first and second electrodes 720, 740 and through the memory element 716, the active region 710 heats up more quickly than the remainder (e.g. inactive region 713) of the memory element 716.

FIG. 8 illustrates a cross-sectional view of a memory cell 800 including a memory element 816 consisting of a body of phase change material having a non-constant additive concentration profile along an inter-electrode current path through memory element 816. The non-constant additive concentration profile includes a first additive concentration profile in an active region 810 and a second additive concentration profile in an inactive region 813 outside the active region 810. The active region 810 comprises phase change material domains within a dielectric-rich mesh (not shown), caused by separation of the silicon oxide doping from the phase change alloy.

The memory cell 800 includes a pillar-shaped memory element 816 contacting first and second electrodes 820, 840 at top and bottom surfaces 822, 824, respectively. The memory element 816 has a width 817 substantially the same as that of the first and second electrodes 820, 840 to define a multi-layer pillar surrounded by dielectric (not shown). As used herein, the term "substantially" is intended to accommodate manufacturing tolerances. In operation, as current passes between the first and second electrodes 820, 840 and through the memory element 816, the active region 810 heats up more quickly than the remainder (e.g. inactive region 813) of the memory element.

FIG. 9 illustrates a cross-sectional view of a memory cell 900 including a memory element 916 consisting of a body of phase change material having a non-constant additive concentration profile along an inter-electrode current path through memory element 916. The non-constant additive concentration profile includes a first additive concentration profile in an active region 910 and a second additive concentration profile in an inactive region 913 outside the active region 910. The active region 910 comprises phase change material domains within a dielectric-rich mesh (not shown), caused by separation of the silicon oxide doping from the phase change alloy.

The memory cell 900 includes a pore-type memory element 916 surrounded by dielectric (not shown) contacting first and second electrodes 920, 940 at top and bottom surfaces respectively. The memory element has a width less than that of the first and second electrodes, and in operation as current passes between the first and second electrodes and through the memory element the active region heats up more quickly than the remainder of the memory element.

As will be understood, the non-constant additive concentration profiles described herein are not limited to the memory cell structures described herein and generally include memory cells having an active region comprising phase change material, in which the active region transitions between solid phases having detectable electrical characteristics.

FIG. 10 is a simplified block diagram of an integrated circuit 1010 including a memory array 1012 implemented using memory cells having a non-constant additive concentration profile as described herein. A word line decoder 1014 having read, set and reset modes is coupled to and in electrical communication with a plurality of word lines 1016 arranged along rows in the memory array 1012. A bit line (column) decoder 1018 is in electrical communication with a plurality of bit lines 1020 arranged along columns in the array 1012 for reading, setting, and resetting the phase change memory cells (not shown) in array 1012. Addresses are supplied on bus 1022 to word line decoder and drivers 1014 and bit line decoder 1018. Sense circuitry (Sense amplifiers) and data-in structures in block 1024, including voltage and/or current sources for the read, set, and reset modes are coupled to bit line decoder 1018 via data bus 1026. Data is supplied via a data-in line 1028 from input/output ports on integrated circuit 1010, or from other data sources internal or external to integrated circuit 1010, to data-in structures in block 1024. Other circuitry 1030 may be included on integrated circuit 1010, such as a general purpose processor or special purpose application circuitry, or a combination of modules providing system-on-a-chip functionality supported by array 1012. Data is supplied via a data-out line 1032 from the sense amplifiers in block 1024 to input/output ports on integrated circuit 1010, or to other data destinations internal or external to integrated circuit 1010.

A controller 1034 implemented in this example, using a bias arrangement state machine, controls the application of bias circuitry voltage and current sources 1036 for the application of bias arrangements including read, program, erase, erase verify and program verify voltages and/or currents for the word lines and bit lines. In addition, bias arrangements for melting/cooling cycling may be implemented as mentioned above. Controller 1034 may be implemented using special-purpose logic circuitry as known in the art. In alternative embodiments, controller 1034 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1034.

Figure 11:
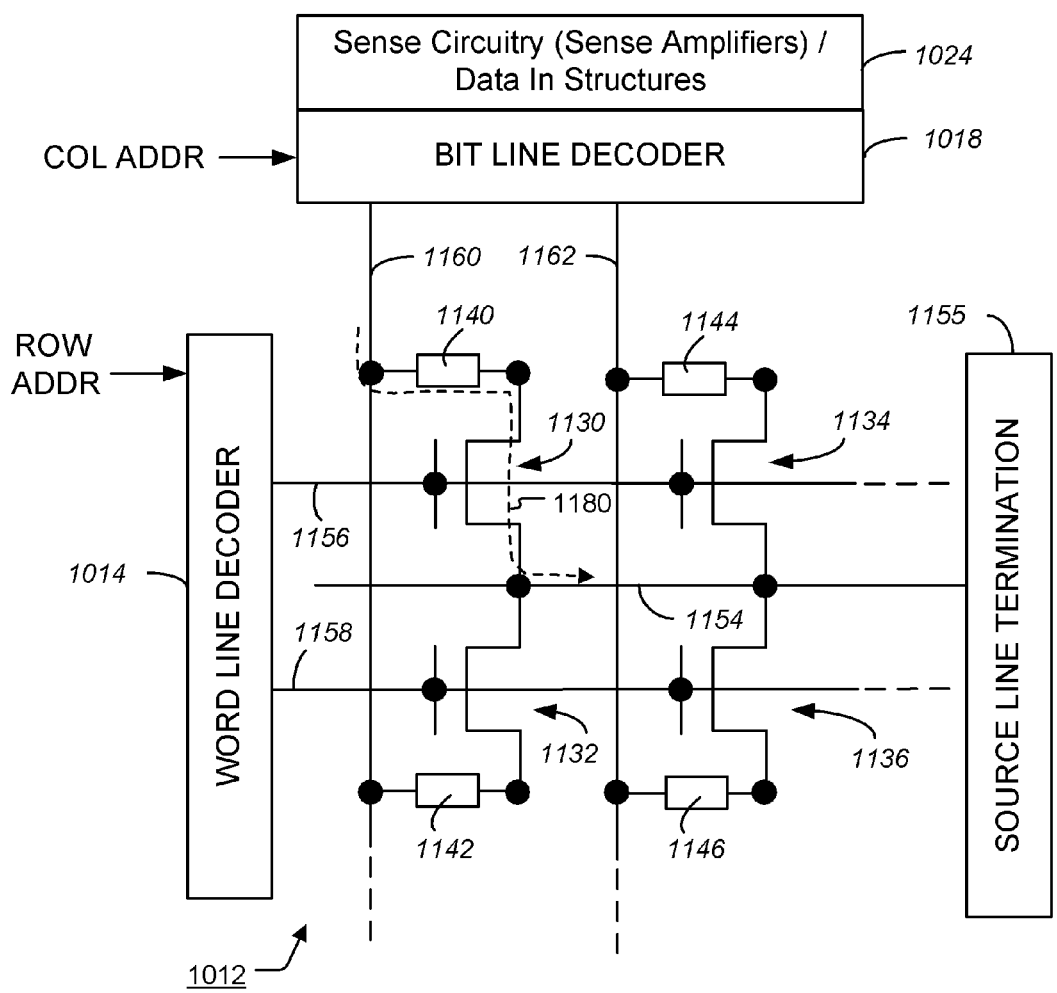
FIG. 11 is a simplified schematic diagram of a memory array having phase change memory cells as described herein.

As shown in FIG. 11, each of the memory cells of array 1012 includes an access transistor (or other access device such as a diode) and memory element having an active region comprising phase change domains within a dielectric-rich mesh. In FIG. 11 four memory cells 1130, 1132, 1134, 1136 having respective memory elements 1140, 1142, 1144, 1146 are illustrated, representing a small section of an array that can include millions of memory cells.

Sources of each of the access transistors of memory cells 1130, 1132, 1134, 1136 are connected in common to source line 1154 that terminates in a source line termination circuit 1155, such as a ground terminal. In another embodiment the source lines of the access devices are not electrically connected, but independently controllable. The source line termination circuit 1155 may include bias circuitry such as voltage sources and current sources, and decoding circuits for applying bias arrangements, other than ground, to the source line 1154 in some embodiments.

A plurality of word lines including word lines 1156, 1158 extend in parallel along a first direction. Word lines 1156, 1158 are in electrical communication with word line decoder 1014. The gates of access transistors of memory cells 1130 and 1134 are connected to word line 1156, and the gates of access transistors of memory cells 1132 and 1136 are connected in common to word line 1158.

A plurality of bit lines including bit lines 1160, 1162 extend in parallel in a second direction and are in electrical communication with bit line decoder 1018. In the illustrated embodiment each of the memory elements are arranged between the drain of the corresponding access device and the corresponding bit line. Alternatively, the memory elements may be on the source side of the corresponding access device.

It will be understood that the memory array 1012 is not limited to the array configuration illustrated in FIG. 11, and additional array configurations can also be used. Additionally, instead of MOS transistors, bipolar transistors or diodes may be used as access devices in some embodiments.

In operation, each of the memory cells in the array 1012 stores data depending upon the resistance of the corresponding memory element. The data value may be determined, for example, by comparison of current on a bit line for a selected memory cell to that of a suitable reference current by sense amplifiers of sense circuitry 1024. The reference current can be established so that a predetermined range of currents correspond to a logical "0", and a differing range of currents correspond to a logical "1".

Reading or writing to a memory cell of array 1012, therefore, can be achieved by applying a suitable voltage to one of word lines 1158, 1156 and coupling one of bit lines 1160, 1162 to a voltage source so that current flows through the selected memory cell. For example, a current path 1180 through a selected memory cell (in this example memory cell 1130 and corresponding memory element 1140) is established by applying voltages to the bit line 1160, word line 1156, and source line 1154 sufficient to turn on the access transistor of memory cell 1130 and induce current in path 1180 to flow from the bit line 1160 to the source line 1154, or vice-versa. The level and duration of the voltages applied is dependent upon the operation performed, e.g. a reading operation or a writing operation.

In a reset (or erase) operation of the memory cell 1130, word line decoder 1014 facilitates providing word line 1156 with a suitable voltage pulse to turn on the access transistor of the memory cell 1130. Bit line decoder 1018 facilitates supplying a voltage pulse to bit line 1160 of suitable amplitude and duration to induce a current to flow though the memory element 1140, the current raising the temperature of the active region of the memory element 1140 above the transition temperature of the phase change material and also above the melting temperature to place the phase change material of the active region in a liquid state. The current is then terminated, for example, by terminating the voltage pulses on the bit line 1160 and on the word line 1156, resulting in a relatively quick quenching time as the active region cools to a high resistance generally amorphous phase in the phase change material in the active region to establish a high resistance reset state in the memory cell 1130. The reset operation can also comprise more than one pulse, for example using a pair of pulses.

In a set (or program) operation of the selected memory cell 1130, word line decoder 1014 facilitates providing word line 1156 with a suitable voltage pulse to turn on the access transistor of the memory cell 1130. Bit line decoder 1018 facilitates supplying a voltage pulse to bit line 1160 of suitable amplitude and duration to induce a current to flow through the memory element 1140, the current pulse sufficient to raise the temperature of the active region above the transition temperature and cause a transition in the phase change material in the active region from the high resistance generally amorphous condition into a low resistance generally crystalline condition, this transition lowering the resistance of the memory element 1140 and setting the memory cell 1130 to the low resistance state.

In a read (or sense) operation of the data value stored in the memory cell 1130, word line decoder 1014 facilitates providing word line 1156 with a suitable voltage pulse to turn on the access transistor of the memory cell 1130. Bit line decoder 1018 facilitates supplying a voltage to bit line 1160 of suitable amplitude and duration to induce current to flow through the memory element 1140 that does not result in the memory element undergoing a change in resistive state. The current on the bit line 1160 and through the memory cell 1130 is dependent upon the resistance of, and therefore the data state associated with, the memory cell. Thus, the data state of the memory cell may be determined by detecting whether the resistance of the memory cell 1130 corresponds to the high resistance state or the low resistance state, for example by comparison of the current on bit line 1160 with a suitable reference current by sense amplifiers of sense circuitry 1024.

The materials used in the embodiment described herein comprise a basis phase change material of $Ge_2Sb_2Te_5$ having one or more additives. Additives other than those mentioned herein and other chalcogenides may be used as well. Chalcogens include any of the four elements oxygen (O), sulfur (S), selenium (Se), and Tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60%, and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording," SPIE v.3109, pp. 28-37 (1997). More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Table I below illustrates possible compounds which can be found in the active region of a device having a Si and $SiO_2$ doped $Ge_2Sb_2Te_5$ memory material as described above. As can be seen, $Si_2Te_3$ has a higher melting point and a higher crystallization transition temperature than other possible compounds in the table. Thus, the formation of $Si_2Te_3$ in the active region tends to increase the melting point and increase the crystallization transition temperature of the memory material in the active region. This is believed to stabilize the active region, and suppress void formation.

TABLE 1

| Possible Compound | Melting Temperature | Recrystallization Temperature Point |
|---|---|---|
| $SiO_2$ | 1726° C. | |
| Si | 1414° C. | |
| Ge | 938.3° C. | 520° C. |
| $Si_2Te_3$ | 885° C. | 290° C. |
| GeTe | 724° C. | 180° C. |
| $Ge_2Sb_2Te_5$ | 615° C. | 140° C. |
| Sb | 630° C. | X |
| $Sb_2Te_3$ | 617° C. | 97° C. |
| $Sb_2Te$ | 547.5° C. | 95° C. |
| Te | 449.5° C. | 10° C. |

Table II below illustrates the bonding energy between silicon and the various elements of $Ge_xSb_yTe_z$, Germanium, Antimony, Tellurium. As can be seen, the Silicon-Tellurium bond is stronger than the bonds formed with Tellurium and the other components of the memory material. As a result of the stronger bond, the endurance and data retention characteristics of the memory are improved.

TABLE 2

| Bond | Energy ($KJmol^{-1}$) |
|---|---|
| Ge—Ge | 264.4 ± 6.8 |
| Ge—Sb | X |
| Ge—Te | 396.7 ± 3.3 |
| Sb—Te | 277.4 ± 3.8 |
| Te—Te | 257.6 ± 4.1 |
| Sb—Sb | 301.7 ± 6.3 |
| Si—Ge | 297 |
| Si—Sb | X |
| Si—Te | 448 ± 8 |

As mentioned above, a variety of stable materials, such as dielectrics, with high mixing enthalpy can be utilized as additives to reduce grain size, and segregate on grain boundaries while limiting void formation in the phase change material, including aluminum oxide, silicon carbide and silicon nitride. Also, a variety of reactive additives can be used which tend to react with elements of the phase change material and suppress void formation in the active region. For chalcogenide-based phase change material, reactive additives of this kind can include materials that tend to bond strongly with Tellurium to form higher melting point compounds in the active region of the memory cell, including possibly Scandium, Titanium, Vanadium, Chromium, Manganese, Iron, and Gallium, and possibly other materials selected from elements 14 to 33 of the periodic table (except for the inert gas).

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device having a first electrode, a second electrode and memory element, the memory element comprising:
   phase change memory material in contact with the first and second electrodes, the phase change memory material comprising a basis phase change material and an additive concentration profile distribution between the first and second electrodes that is non-uniform for one or more additives; wherein said basis phase change material is GST, one of the additives is silicon having a higher concentration in an active region in the phase change material and a lower concentration adjacent the second electrode, and another of the additives is silicon dioxide having higher concentration in the active region and in a region between the active region and the second electrode.

2. The device of claim 1, wherein the additive concentration profile distribution is composed of at least two additives having respective concentration distributions which are non-uniform between the first and second electrodes.

3. The device of claim 1, wherein the phase change memory material has a first zone adjacent the first electrode, a second zone encompassing an active region, a third zone between the active region and the second electrode, and a fourth zone adjacent the second electrode, the additive concentration profile varies among the first, second, third and fourth zones.

4. An integrated circuit memory device, comprising:
an array of memory cells, wherein a memory cell in the array comprises a memory device having a first electrode, a second electrode and a memory element, and the memory element includes phase change memory material in contact with the first and second electrodes, the phase change memory material comprising a basis phase change material and an additive, the additive having a distribution between the first and second electrodes that is non-uniform;
decoder circuitry coupled to the array for accessing selected memory cells in the array in response to addresses; and
a controller and supporting circuits, coupled to the array and responsive to commands to execute read, set and reset operations for selected memory cells in the array; wherein said basis phase change material is GST, one of the additives is silicon having a higher concentration in an active region in the phase change material and a lower concentration adjacent the second electrode, and another of the additives is silicon dioxide having higher concentration in the active region and in a region between the active region and the second electrode.

5. The device of claim 4, wherein the additive concentration profile distribution is composed of at least two additives having respective concentration distributions which are non-uniform between the first and second electrodes.

6. The device of claim 4, wherein the phase change memory material has a first zone adjacent the first electrode, a second zone encompassing an active region, a third zone between the active region and the second electrode, and a fourth zone adjacent the second electrode, the additive concentration profile varies among the first, second, third and fourth zones.

7. An integrated circuit memory device, comprising:
an array of memory cells, wherein a memory cell in the array comprises a memory device having a first electrode, a second electrode and a memory element, and the memory element includes phase change memory material in contact with the first and second electrodes and an active region, the phase change memory material including a first layer of a basis phase change material adjacent the first electrode including an active region, and a second layer of the basis phase change material adjacent the second electrode, with a first additive concentration profile distribution in the first layer including a first additive and a second additive concentration profile distribution in a second layer including a second additive; wherein said basis phase change material is GST, said first additive is silicon having a higher concentration in an active region in the phase change material and a lower concentration adjacent the second electrode, and said second additive is silicon dioxide having higher concentration in the active region and in a region between the active region and the second electrode.

8. The device of claim 7, wherein the first additive is selected to improve stability of resistance of the phase change material, and the second additive is selected to reduce changes in density of the phase change memory material during transitions between solid phases.

9. An integrated circuit memory device, comprising:
an array of memory cells, wherein a memory cell in the array comprises a memory device having a first electrode, a second electrode and a memory element, and the memory element includes phase change memory material in contact with the first and second electrodes, the phase change memory material comprising a basis phase change material and an additive, the additive having a distribution between the first and second electrodes that is non-uniform; and
wherein said additive distribution includes 8 at % ±2% at % silicon and 10 at % ±4 at % oxygen in the active region.

10. The device of claim 9, wherein the basis phase change material is GST.

* * * * *